US009270105B2

(12) United States Patent
Ko et al.

(10) Patent No.: US 9,270,105 B2
(45) Date of Patent: Feb. 23, 2016

(54) CLAMPING CIRCUIT, A SEMICONDUCTOR APPARATUS INCLUDING THE SAME, AND A CLAMPING METHOD OF THE SEMICONDUCTOR APPARATUS

(71) Applicant: SAMSUNG ELECTRONICS CO., LTD., Suwon-si, Gyeonggi-do (KR)

(72) Inventors: Jae-hyok Ko, Gyeonggi-do (KR);
Woo-seok Kim, Gyeonggi-do (KR);
Han-gu Kim, Gyeonggi-do (KR);
Sang-young Cho, Gyeonggi-do (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 151 days.

(21) Appl. No.: 14/016,644

(22) Filed: Sep. 3, 2013

(65) Prior Publication Data
US 2014/0092508 A1    Apr. 3, 2014

(30) Foreign Application Priority Data
Sep. 28, 2012    (KR) ........................ 10-2012-0109262

(51) Int. Cl.
*H02H 3/22*    (2006.01)
*H02H 3/20*    (2006.01)
*H02H 9/04*    (2006.01)
*H01L 27/02*    (2006.01)

(52) U.S. Cl.
CPC ................. *H02H 3/20* (2013.01); *H02H 9/046* (2013.01); *H01L 27/0266* (2013.01); *H02H 9/04* (2013.01); *H02H 9/043* (2013.01)

(58) Field of Classification Search
USPC .................................................. 361/56, 111
See application file for complete search history.

(56) References Cited

U.S. PATENT DOCUMENTS

| | | | |
|---|---|---|---|
| 6,064,249 A | 5/2000 | Duvvury et al. | |
| 6,462,601 B1 * | 10/2002 | Chang et al. | .................. 327/313 |
| 7,477,496 B2 | 1/2009 | Kwon | |
| 7,495,873 B2 | 2/2009 | Bhattacharya et al. | |
| 7,796,367 B2 | 9/2010 | Moon | |
| 7,804,670 B2 | 9/2010 | Reynders et al. | |
| 7,916,439 B2 | 3/2011 | Zecri et al. | |
| 2007/0195472 A1 * | 8/2007 | Kwak et al. | ..................... 361/56 |
| 2007/0206339 A1 * | 9/2007 | Choi | ............................. 361/111 |
| 2010/0103572 A1 | 4/2010 | Worley | |
| 2010/0254051 A1 | 10/2010 | Jeon et al. | |
| 2010/0302693 A1 | 12/2010 | Hayashi | |
| 2011/0255201 A1 | 10/2011 | Shimomura et al. | |
| 2013/0278301 A1 * | 10/2013 | Huynh | ......................... 327/110 |

FOREIGN PATENT DOCUMENTS

JP    2008-035067    2/2008

* cited by examiner

*Primary Examiner* — Danny Nguyen
(74) *Attorney, Agent, or Firm* — F. Chau & Associates, LLC

(57) ABSTRACT

A semiconductor apparatus that includes: a first high-voltage transistor having a gate and a first electrode, wherein the first electrode is connected to a first pad and a parasitic capacitance forms between the gate and the first electrode; and a clamping circuit that is connected to the gate of the first high-voltage transistor, wherein the clamping circuit detects a change in a level of a gate voltage of the first high-voltage transistor due to electrostatic discharge, and clamps the gate voltage of the first high-voltage transistor according to a result of the detection.

20 Claims, 13 Drawing Sheets

FIG. 15

|  |  | VIN | Vg | Clamping Circuit |
|---|---|---|---|---|
| Normal | | VIN | Vg < VIN | Disable |
| NOP | ESD X | 0 | Floating | Disable |
| | ESD Event | 0 ~ Vg | Vg > VIN | Enable | ns # CLAMPING CIRCUIT, A SEMICONDUCTOR APPARATUS INCLUDING THE SAME, AND A CLAMPING METHOD OF THE SEMICONDUCTOR APPARATUS

CROSS-REFERENCE TO RELATED APPLICATION

This application claims priority under 35 U.S.C. §119 to Korean Patent Application No. 10-2012-0109262, filed on Sep. 28, 2012, in the Korean Intellectual Property Office, the disclosure of which is incorporated by reference herein in its entirety.

BACKGROUND

1. Technical Field

The inventive concept relates to a clamping circuit, and more particularly, to a clamping circuit, a semiconductor apparatus including the same, and a clamping method of the semiconductor apparatus.

2. Discussion of the Related Art

A semiconductor apparatus includes a transistor such as a metal-oxide semiconductor field-effect transistor (MOSFET) for inputting/outputting a signal through a pad or processing an internal signal, for example. An electrostatic discharge (ESD) may damage a sensitive component of the semiconductor apparatus, and thus the semiconductor apparatus may include a device for protecting the component from an ESD. For example, the semiconductor apparatus may include an ESD protection circuit for protecting sensitive electronics and may dissipate an electrostatic charge build up. However, various types of semiconductor apparatuses still suffer performance degradation and device damage due to an ESD.

SUMMARY

Exemplary embodiments of the inventive concept provide a clamping circuit that may perform a clamping operation for a semiconductor apparatus, a semiconductor apparatus including the clamping circuit, and a clamping method of the semiconductor apparatus.

According to an exemplary embodiment of the inventive concept, there is provided a semiconductor apparatus including: a first high-voltage transistor having a gate and a first electrode, wherein the first electrode is connected to a first pad and a parasitic capacitance forms between the gate and the first electrode; and a clamping circuit that is connected to the gate of the first high-voltage transistor, wherein the clamping circuit detects a change in a level of a gate voltage of the first high-voltage transistor due to electrostatic discharge (ESD), and clamps the gate voltage of the first high-voltage transistor according to a result of the detection.

The first high-voltage transistor may be a power switch that controls transmission of power.

The first high-voltage transistor may have a second electrode connected to a ground voltage and the first high-voltage transistor may be a lateral diffused metal-oxide semiconductor (LDMOS) transistor.

The clamping circuit may include: a triggering circuit that generates a triggering voltage, wherein a level of the triggering voltage changes in response to an increase in a level of the gate voltage of the first high-voltage transistor; and a clamping transistor that controls a connection between the gate of the first high-voltage transistor and a ground voltage in response to the triggering voltage.

The triggering circuit may include: a pull-up unit that is connected between the gate of the first high-voltage transistor and a gate of the clamping transistor and pulls up the triggering voltage; and a pull-down unit that is connected between the pull-up unit and the ground voltage and pulls down the triggering voltage.

The pull-up unit may include a metal-oxide semiconductor (MOS) transistor having a source to which a first voltage of the gate of the first high-voltage transistor is applied and a gate connected to a first node that applies a second voltage, wherein a bulk of the MOS transistor is electrically connected to the second voltage.

A parasitic diode component may be formed between the gate of the first high-voltage transistor and the first node.

The semiconductor apparatus may further include a driving circuit that includes at least one circuit for controlling driving of the first high-voltage transistor, and has a node whose voltage is applied as an operating voltage of the clamping circuit.

The semiconductor apparatus may further include a second high-voltage transistor, wherein the clamping circuit is commonly connected to the gate of the first high-voltage transistor and a gate of the second high-voltage transistor.

According to an exemplary embodiment of the inventive concept, there is provided a clamping circuit connected to a gate of an LDMOS transistor and including: an ESD detection unit that detects a change in a potential of the gate of the LDMOS transistor due to ESD and outputs a control signal; and a clamping transistor that is connected to the gate of the LDMOS transistor, wherein a gate of the clamping transistor receives the control signal, and the clamping transistor clamps the gate of the LDMOS transistor in response to the control signal.

The ESD detection unit may include a first MOS transistor that has a first electrode connected to the gate of the LDMOS transistor and a second electrode connected to the gate of the clamping transistor, and may generate the control signal by switching the gate voltage of the LDMOS transistor.

The first MOS transistor may receive a first voltage of the gate of the LDMOS transistor through the first electrode, receive a second voltage through a gate of the first MOS transistor, and be turned on due to a level difference between the first voltage and the second voltage.

A bulk of the first MOS transistor may be electrically connected to the second voltage.

When the ESD occurs, the first MOS transistor may generate the control signal through a first path of a MOS channel of the first MOS transistor and a second path of a parasitic bipolar component.

A parasitic diode component may be formed between the gate of the LDMOS transistor and a node that applies the second voltage, and during an initial period of the ESD, the first voltage may be greater than the second voltage.

The ESD detection unit may further include a second MOS transistor that is connected between a ground voltage and the second electrode of the first MOS transistor and pulls down the control signal to a ground voltage level.

According to an exemplary embodiment of the inventive concept, there is provided a clamping method of a semiconductor apparatus, the clamping method including: applying a first voltage of a gate of a high-voltage transistor to a clamping circuit; when a level of the first voltage changes due to ESD, generating a control signal by switching the first voltage; and in response to the control signal, clamping a gate voltage of the high-voltage transistor by using a clamping transistor in the clamping circuit connected to the gate of the high-voltage transistor.

The high-voltage transistor may be an LDMOS transistor.

The clamping method may further include receiving a second voltage at a node of the semiconductor apparatus; and activating the control signal when a level difference between the first voltage and the second voltage is equal to or greater than a threshold voltage.

The control signal may be generated by a MOS transistor that has a first electrode connected to the first voltage, a second electrode connected to a gate of the clamping transistor, and a gate connected to the second voltage, and a bulk of the MOS transistor may be electrically connected to the second voltage.

The second voltage may change from a ground voltage level to a first level when the ESD occurs, and while the second voltage changes to the first level, the control signal may be activated.

When the semiconductor system normally operates, the second voltage may have a ground voltage level, and a clamping operation of the clamping transistor may be inactivated.

According to an exemplary embodiment of the inventive concept, there is provided a semiconductor system including: an internal integrated circuit that is connected to a first pad; a semiconductor chip including a high-voltage transistor that is connected to the internal integrated circuit through the first pad, wherein the high-voltage transistor has a gate and a first electrode, the first electrode is connected to the first pad and a parasitic capacitance forms between the gate and the first electrode; and a clamping circuit that is disposed in the semiconductor chip and connected to the gate of the high-voltage transistor, wherein the clamping circuit detects an increase in a level of a gate voltage of the high-voltage transistor due to ESD, and clamps the gate voltage of the high-voltage transistor according to a result of the detection.

When the semiconductor chip normally operates, the clamping circuit may be inactivated, and when the ESD is detected during a non-operation period of the semiconductor chip, the clamping circuit may be selectively activated.

The semiconductor chip may receive an input voltage from the internal integrated circuit, and control the clamping circuit to be activated according to a level difference between the input voltage and the gate voltage of the high-voltage transistor.

According to an exemplary embodiment of the inventive concept there is provided a semiconductor apparatus including a high-voltage transistor having a gate, a drain and a source, wherein the drain is connected to a pad and the source is connected to a ground voltage; and a clamping circuit connected to the gate and configured to clamp a voltage at the gate in response to electrostatic discharge by connecting the ground voltage to the gate.

The high-voltage transistor may be an LDMOS transistor.

The clamping circuit may include a CMOS circuit connected to the gate and a clamping transistor connected to the gate.

The CMOS circuit may be connected to a gate of the clamping transistor.

The CMOS circuit may be connected to an input voltage.

BRIEF DESCRIPTION OF THE DRAWINGS

The above and other features of the inventive concept will become more apparent by describing in detail exemplary embodiments thereof with reference to the accompanying drawings in which:

FIG. 15 is a table showing levels of various voltages in the semiconductor system of FIG. 14.

DETAILED DESCRIPTION OF THE EMBODIMENTS

Hereinafter, exemplary embodiments of the inventive concept will be described in detail with reference to the accompanying drawings. The inventive concept may, however, be embodied in many different forms and should not be construed as limited to the exemplary embodiments set forth herein.

Figure 1:
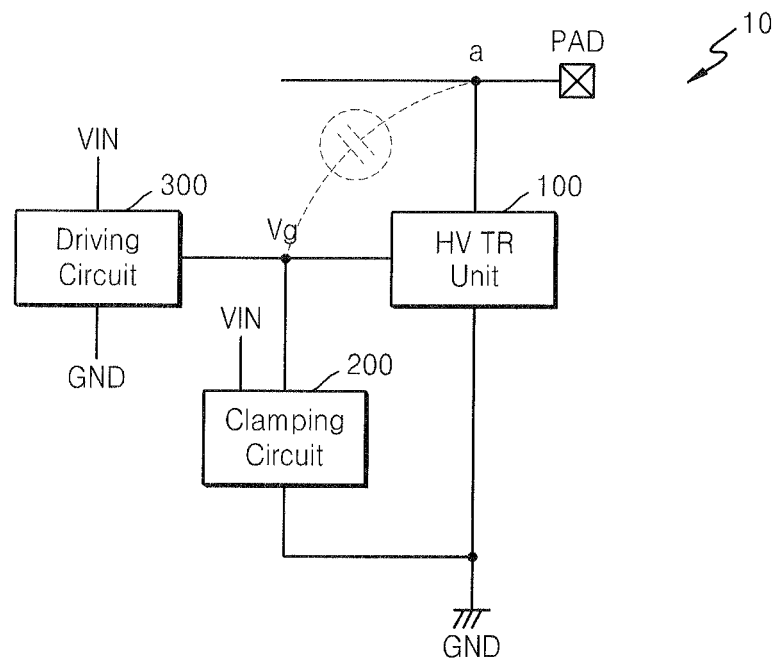
FIG. 1 is a block diagram illustrating a semiconductor apparatus according to an exemplary embodiment of the inventive concept.

FIG. 1 is a block diagram illustrating a semiconductor apparatus 10 according to an exemplary embodiment of the inventive concept. Referring to FIG. 1, the semiconductor apparatus 10 may include a high-voltage transistor unit 100, a clamping circuit 200, and a driving circuit 300.

The semiconductor apparatus 10 may perform various operations related to voltage or power. The semiconductor apparatus 10 may be formed as a semiconductor chip that inputs/outputs a signal through at least one pad. When the semiconductor apparatus 10 is used to receive main power and converts the main power into a voltage for other circuit devices or distributes the main power, or is used as a path through which a high voltage or a high current flows for high-voltage driving of an external integrated circuit, the high-voltage transistor unit 100 may include at least one high-voltage transistor having a relatively large size.

The high-voltage transistor may be a silicon-based semiconductor, for example, a gallium nitride (GaN) transistor, a silicon carbide (SiC) transistor or a lateral diffused metal-oxide semiconductor (LDMOS) transistor. For example, since the LDMOS transistor may have a shallow trench isolation (STI) gap structure and may be used as a power transistor connected to a pad PAD during an application, the LDMOS transistor may have a large size. Accordingly, the LDMOS transistor may have a large parasitic capacitance formed between one electrode (for example, a drain) and a gate, and the parasitic capacitance may correspond to an overlapping capacitance component. In the LDMOS transistor, as an electrode which forms a gate overlaps with at least a portion of a channel along with a source region, a parasitic capacitance component may be formed between a drain region and the gate forming electrode. Hereinafter, it is assumed that the high-voltage transistor unit 100 includes an LDMOS transistor as the high-voltage transistor.

When the high-voltage transistor unit 100 includes an LDMOS transistor (not shown), an electrostatic discharge (ESD) charge may be injected into a drain of the LDMOS transistor when an ESD event occurs. The clamping circuit 200 performs a clamping operation for at least one node of the high-voltage transistor unit 100. For example, since a potential may be induced on a gate of the LDMOS transistor due to a capacitance component between the drain and the gate of the LDMOS transistor when the ESD event occurs, the clamping circuit 200 may perform a clamping operation on a first voltage (e.g., a gate voltage Vg) applied to the gate of the LDMOS transistor.

The high-voltage transistor unit 100 is electrically connected to a pad PAD formed in the semiconductor apparatus 10, and the LDMOS transistor included in the high-voltage transistor unit 100 is electrically connected to the pad PAD through a node 'a'. For example, the LDMOS transistor may be connected between the node 'a' and a ground voltage GND (or a ground voltage supply that applies a ground voltage GND). The driving circuit 300, which is a circuit for controlling driving of the high-voltage transistor unit 100, may operate by receiving a second voltage VIN and the ground voltage GND, and may drive the gate of the LDMOS transistor included in the high-voltage transistor unit 100. The second voltage VIN may be applied to the clamping circuit 200 to be involved in a clamping operation. For example, the second voltage VIN may be generated in the semiconductor apparatus 10 by using an external power supply voltage, or an integrated circuit (IC) which may be disposed outside the semiconductor apparatus 10 and a voltage generated by the IC may be applied as the second voltage VIN to the semiconductor apparatus 10. Hereinafter, the second voltage VIN applied to the clamping circuit 200 is referred to as an input voltage VIN.

The clamping circuit 200 performs a clamping operation by being connected to at least one node of the high-voltage transistor unit 100. For example, the clamping circuit 200 may clamp the gate voltage Vg of the LDMOS transistor by being connected to the gate of the LDMOS transistor. In addition, another voltage may be applied to the clamping circuit 200 as a voltage for operating the clamping circuit 200. For example, the input voltage VIN applied to the driving circuit 300 may be commonly applied to the clamping circuit 200. Although not shown in FIG. 1, the clamping circuit 200 does not have to commonly receive the input voltage VIN. For example, the clamping circuit 200 may receive a voltage having a level different from that of the input voltage VIN by being connected to one node of the driving circuit 300.

A clamping operation of the semiconductor apparatus 10 of FIG. 1 will now be explained.

As an ESD event occurs, an ESD charge is injected into the node 'a' connected to the drain of the LDMOS transistor, and a potential (or a voltage level) of the gate of the LDMOS transistor increases according to a capacitance component between the gate and the drain of the LDMOS transistor. The clamping circuit 200 detects a change in the voltage level of the gate voltage Vg by being connected to the gate of the LDMOS transistor. In other words, the clamping circuit 200 detects an increase in the gate voltage Vg due to the ESD event. In addition, according to the detection, the clamping circuit 200 generates an internal control signal (not shown) based on a difference between a level of the gate voltage Vg and a level of the input voltage VIN, and applies the control signal to a gate of a clamping transistor in the clamping circuit 200. As the clamping transistor connected to the gate of the LDMOS transistor is turned on, the gate voltage Vg of the LDMOS transistor is clamped through the clamping transistor and the ground voltage GND.

The input voltage VIN has a predetermined voltage level when the semiconductor apparatus 10 normally operates, or when a semiconductor system including the semiconductor apparatus 10 normally operates. By contrast, when the semiconductor apparatus 10 or the semiconductor system does not operate (e.g., during a non-operation period) or before the semiconductor system uses the semiconductor apparatus 10, the input voltage VIN may maintain a ground voltage level. When an ESD event occurs, a level of the input voltage VIN may vary as an ESD charge is injected and a level of the gate voltage Vg increases. For example, a parasitic diode component may be formed between the gate of the LDMOS transistor and a node that applies the input voltage VIN to the clamping circuit 200. When a level of the gate voltage Vg of the LDMOS transistor increases during an initial period of an ESD event, a level of the input voltage VIN may increase as well.

Figure 2:
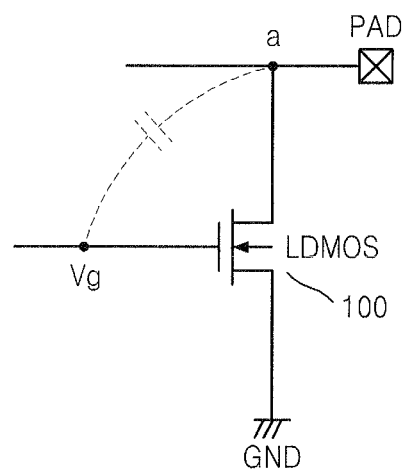
FIG. 2 is a circuit diagram illustrating a high-voltage transistor unit of the semiconductor apparatus of FIG. 1, according to an exemplary embodiment of the inventive concept.

FIG. 2 is a circuit diagram illustrating the high-voltage transistor unit 100 of the semiconductor apparatus 10 of FIG. 1, according to an exemplary embodiment of the inventive concept. Referring to FIG. 2, the high-voltage transistor unit 100 may include the LDMOS transistor LDMOS having the drain connected to the pad PAD and a source connected to the ground voltage GND (or a ground voltage supply that applies the ground voltage GND). The gate of the LDMOS transistor LDMOS is controlled in response to a driving signal output from the driving circuit 300 of FIG. 1. In FIG. 2, the LDMOS transistor LDMOS is exemplarily shown as an N-type LDMOS transistor (NLDMOS). In addition, the LDMOS transistor LDMOS may have a relatively large overlapping capacitance component (or a parasitic capacitance component) formed between the drain and the gate thereof. Accordingly, as an ESD charge is injected into the drain of the LDMOS transistor LDMOS through the pad PAD when an ESD event occurs, a level of the gate voltage Vg of the LDMOS transistor LDMOS increases due to the overlapping capacitance component.

The LDMOS transistor LDMOS may have a relatively large size to switch a high voltage, for example, a size of thousands of $\mu m$ to tens of $\mu m$. Assuming that the LDMOS transistor LDMOS is directly connected to the pad PAD, when an ESD event occurs, a level of the gate voltage Vg increases to turn on a channel, thereby heating the channel. When the channel is excessively heated, an ESD level may be reduced.

Figure 3:
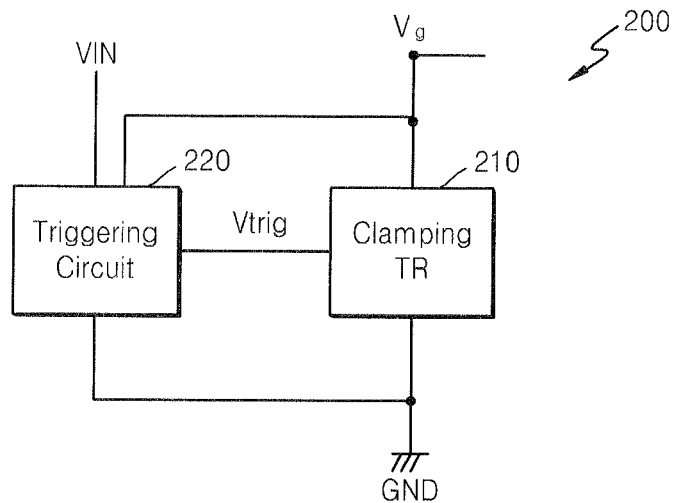
FIG. 3 is a block diagram illustrating a clamping circuit of the semiconductor apparatus of FIG. 1, according to an exemplary embodiment of the inventive concept.

FIG. 3 is a block diagram illustrating the clamping circuit 200 of the semiconductor apparatus 10 of FIG. 1, according to an exemplary embodiment of the inventive concept. Referring to FIG. 3, the clamping circuit 200 may include a clamping transistor 210 and a triggering circuit 220. The clamping transistor 210 clamps a gate voltage of a high-voltage transistor and may be referred to as a gate clamping transistor.

Referring to FIGS. 1 and 3, the clamping transistor 210 is connected between the gate of the LDMOS transistor LDMOS and the ground voltage GND, receives a triggering voltage Vtrig output from the triggering circuit 220 as a control signal, and clamps the gate voltage Vg of the LDMOS transistor LDMOS in response to the control signal. The triggering circuit 220 includes one or more circuits for generating the triggering voltage Vtrig, and at least one node of the triggering circuit 220 is connected to the gate of the LDMOS transistor LDMOS. In addition, the triggering circuit 220 is connected to the input voltage VIN and the ground voltage GND, and outputs the triggering voltage Vtrig having a level that varies according to a level difference between the input voltage YIN and the gate voltage Vg of the LDMOS transistor LDMOS.

The triggering circuit 220 outputs the triggering voltage Vtrig to a gate of the clamping transistor 210, and pulls up or pulls down the triggering voltage Vtrig according to a level difference between the input voltage VIN and the gate voltage Vg. For example, while the triggering voltage Vtrig is maintained in a pull-down state, when an ESD event occurs, the triggering circuit 220 detects a level difference between the gate voltage Vg and the input voltage VIN as a level of the gate voltage Vg increases, and pulls up and outputs the triggering voltage Vtrig.

Figure 4:
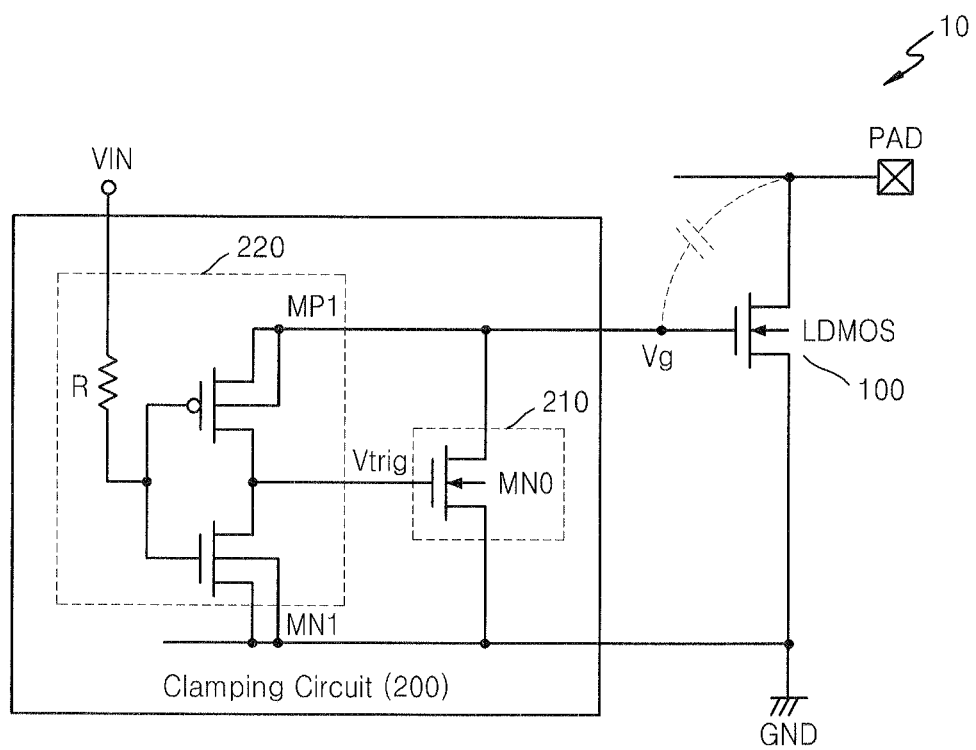
FIG. 4 is a circuit diagram illustrating the semiconductor apparatus of FIG. 1, according to an exemplary embodiment of the inventive concept.

FIG. 4 is a circuit diagram illustrating the semiconductor apparatus 10 of FIG. 1, according to an exemplary embodiment of the inventive concept. Referring to FIG. 4, the semiconductor apparatus 10 may include the LDMOS transistor LDMOS as the high-voltage transistor unit 100, and the LDMOS transistor LDMOS may be an NLDMOS transistor. Although an N-type LDMOS transistor is illustrated in FIG. 4, the present exemplary embodiment is not limited thereto and another type of LDMOS transistor may be used.

An overlapping capacitance component may be formed between the gate and the drain of the LDMOS transistor LDMOS. In addition, the clamping circuit 200 may include the clamping transistor 210 and the triggering circuit 220. The clamping transistor 210 may include a first NMOS transistor MN0. One electrode (for example, a drain) of the first NMOS transistor MN0 may be connected to the gate of the LDMOS transistor LDMOS, and the other electrode (for example, a source) of the first NMOS transistor MN0 may be connected to the ground voltage GND.

The triggering circuit 220 may include at least one transistor and a resistor. As shown in FIG. 4, the triggering circuit 220 may be formed as a complementary metal-oxide semiconductor (CMOS), and may generate the triggering voltage Vtrig whose level varies as a level of the gate voltage Vg of the LDMOS transistor LDMOS increases. The triggering circuit 220 may include a pull-up unit that is connected between the gate of the LDMOS transistor LDMOS and a gate of the first NMOS transistor MN0 and pulls up the triggering voltage Vtrig, and a pull-down unit that is connected between the gate of the first NMOS transistor MN0 and the ground voltage GND and pulls down the triggering voltage Vtrig.

The pull-up unit and the pull-down unit may each include a MOS transistor that is switched in response to a predetermined voltage. For example, the pull-up unit may include a first PMOS transistor MP1 that is switched by the input voltage VIN, and the pull-down unit may include a second NMOS transistor MN1 that is switched by the input voltage VIN. The first PMOS transistor MP1 and the second NMOS transistor MN1 may be connected to the input voltage VIN through a resistor R. In addition, a bulk and a drain of the first PMOS transistor MP1 may be connected to each other, and a bulk of the second NMOS transistor MN1 may be connected to the ground voltage GND.

The first PMOS transistor MP1 is turned on/off based on a level difference between the input voltage VIN and the gate voltage Vg. When a level of the gate voltage Vg increases due to an ESD event, the first PMOS transistor MP1 is turned on to switch the gate voltage Vg, and the gate voltage Vg is transmitted to the gate of the first NMOS transistor MN0. In other words, as the first PMOS transistor MP1 is turned on, the triggering voltage Vtrig is pulled up, and the first NMOS transistor MN0 of the clamping transistor 210 is turned on due to the pulled-up triggering voltage Vtrig. Accordingly, the gate voltage Vg of the LDMOS transistor LDMOS is clamped through the ground voltage GND, and thus a level of the gate voltage Vg is reduced.

An operation of the semiconductor apparatus 10 of FIG. 4 will be explained in detail. When the semiconductor apparatus 10 normally operates or when a semiconductor system including the semiconductor apparatus 10 normally operates, the input voltage VIN has a predetermined voltage level that is higher than that of the gate voltage Vg of the LDMOS transistor LDMOS. Accordingly, the first PMOS transistor MP1 is turned off, and a gate of the second NMOS transistor MN1 is connected to a power supply that supplies power and thus the second NMOS transistor MN1 is maintained in an ON state. Accordingly, since the clamping transistor 210 connected to the gate of the LDMOS transistor LDMOS is maintained in an OFF state, a clamping operation on the gate voltage Vg is inactivated. In other words, the clamping circuit 200 included in the semiconductor apparatus 10 does not affect a normal operation of the semiconductor apparatus 10 or the semiconductor system including the semiconductor apparatus 10. For example, when the semiconductor apparatus 10 or the semiconductor system including the semiconductor apparatus 10 normally operates, a charge injected due to an ESD event may be clamped by another circuit block (not shown) connected to the pad PAD.

Before the semiconductor system uses the semiconductor apparatus 10 or when the semiconductor system including the semiconductor apparatus 10 does not operate, an ESD event may occur. In this case, the clamping circuit 200 may perform a clamping operation in response to the ESD event. For example, when a charge due to an ESD event is injected and thus a level of the gate voltage Vg increases, the input voltage VIN, which has no direct connection relationship with the pad PAD, maintains a ground voltage level during an initial period of the ESD event. Although not shown in FIG. 4, a parasitic diode component may exist between the node that applies the input voltage VIN and the gate of the LDMOS transistor LDMOS. Accordingly, the input voltage VIN increases according to a level of the gate voltage Vg, and when the ESD event ends, the input voltage VIN returns to the ground voltage level.

Accordingly, since the input voltage VIN is maintained to have a level lower than a level of the gate voltage Vg when an ESD pulse increases during an initial period of the ESD event, a channel of the first PMOS transistor MP1 is turned on, and thus a level of the triggering voltage Vtrig increases to be higher than a threshold voltage of the first NMOS transistor MN0. The second NMOS transistor MN1 may be designed to have a weak pull-down strength so that a level of the triggering voltage Vtrig is not strongly limited to a ground voltage level when an ESD event occurs. To prevent the second NMOS transistor MN1 from being damaged as an ESD charge is injected to the node that applies the input voltage VIN, the resistor R may be connected between the gate of the second NMOS transistor MN1 and the input voltage supply that applies the input voltage VIN.

Figure 5A:
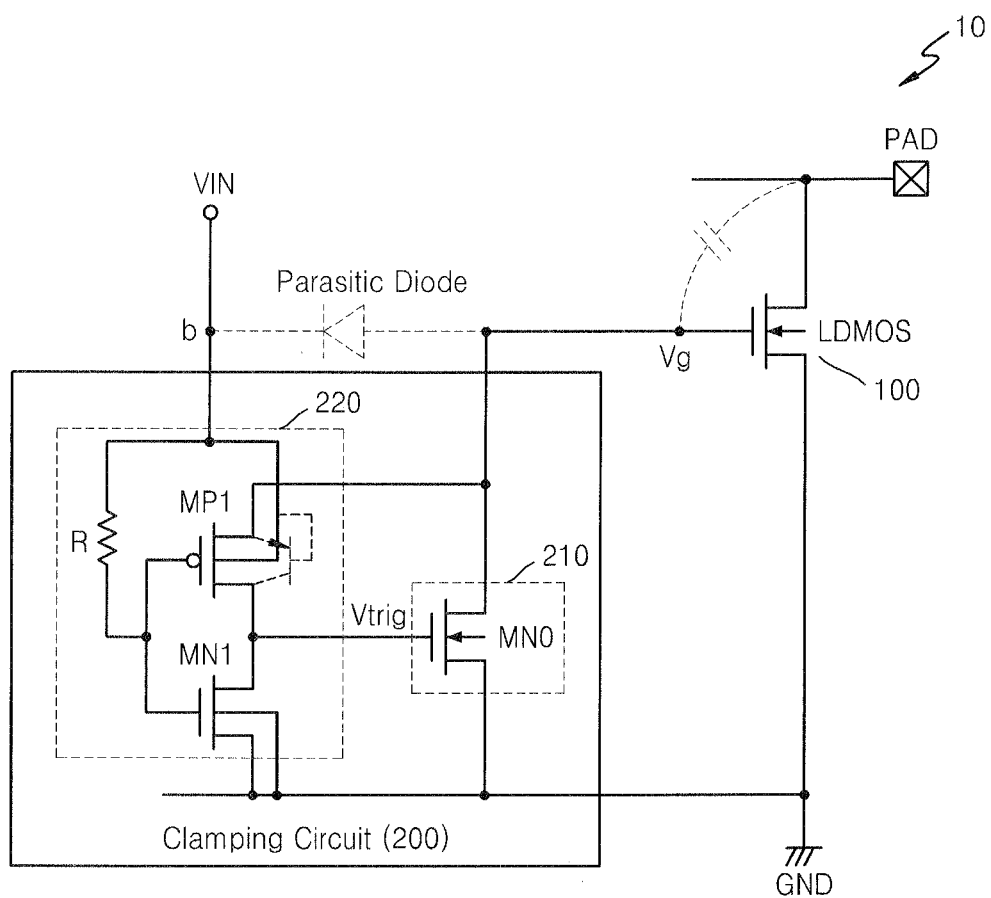
FIGS. 5A and 5B are circuit diagrams illustrating a semiconductor apparatus according to an exemplary embodiment of the inventive concept.
Figure 5B:
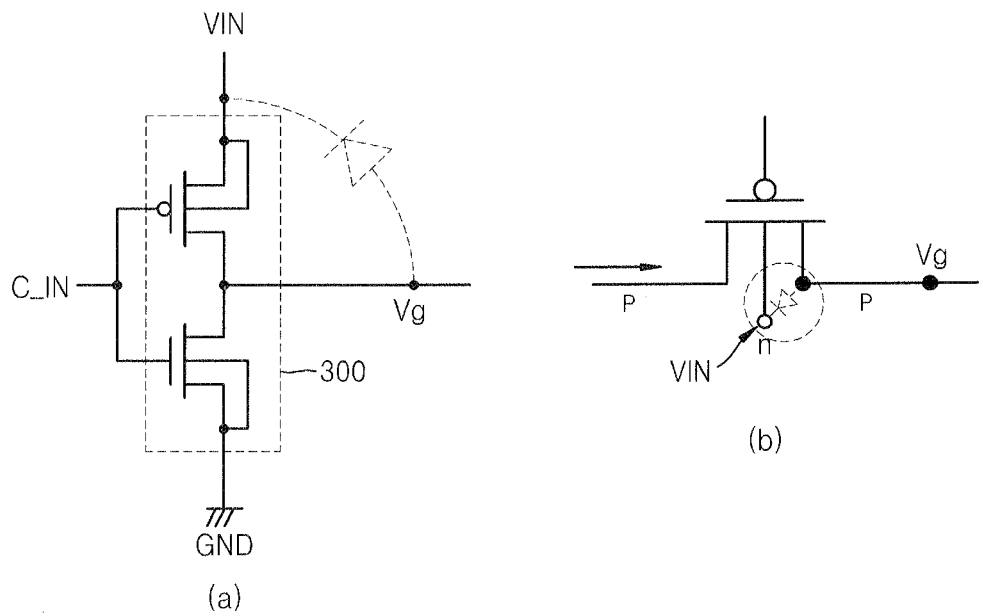

FIGS. 5A and 5B are circuit diagrams illustrating the semiconductor apparatus 10 according to an exemplary embodiment of the inventive concept. Referring to FIG. 5A, the semiconductor apparatus 10 may include the LDMOS transistor LDMOS as the high-voltage transistor unit 100, and the clamping circuit 200 may include the clamping transistor 210 and the triggering circuit 220. The clamping transistor 210 may include the first NMOS transistor MN0, and the triggering circuit 220 may include the first PMOS transistor MP1 and the second NMOS transistor MN1. Operations of elements of FIG. 5A that are the same as those of FIG. 4 may be performed in substantially the same manner and thus a detailed explanation thereof will not be given.

Referring to FIG. 5A, a source of the first PMOS transistor MP1 is connected to the gate voltage Vg, and the drain of the first PMOS transistor MP1 is connected to the gate of the first NMOS transistor MN0. In addition, a gate of the first PMOS transistor MP1 is connected to the input voltage VIN through the resistor R, and the bulk of the first PMOS transistor MP1 is connected to the input voltage VIN.

In addition, the gate of the LDMOS transistor LDMOS is connected to a node 'b' that applies the input voltage YIN. The node 'b' may be a node that is directly connected to the input voltage supply that applies the input voltage VIN. Alternatively, a separate circuit (for example, the driving circuit 300 of FIG. 1) that operates by receiving the input voltage VIN may be disposed in the semiconductor apparatus 10, and the node 'b' may be any one node in the driving circuit 300. When the node 'b' is a node in the driving circuit 300 and the driving circuit 300 is driven by receiving another power supply voltage, the node 'b' in the driving circuit 300 may receive a voltage and a voltage of the node 'b' may be applied as the input voltage VIN to the clamping circuit 200. Alternatively, when the driving circuit 300 is driven by receiving the input voltage VIN, the node 'b' may apply a voltage having a level different from that of the input voltage VIN to the clamping circuit 200.

A parasitic diode component exists between the node 'b' and the gate of the LDMOS transistor LDMOS. Accordingly, when a level of the gate voltage Vg of the LDMOS transistor LDMOS changes, a level of the input voltage (for example, a voltage of the node 'b') also changes. For example, before the semiconductor system uses the semiconductor apparatus 10, or when the semiconductor system including the semiconductor apparatus 10 does not operate, the input voltage VIN may have a ground voltage level. Since the input voltage VIN has no direct connection relationship with the pad PAD to which the LDMOS transistor LDMOS is connected, the input voltage VIN during an initial period of the ESD event is maintained at the ground voltage level.

Next, as a level of the gate voltage Vg of the LDMOS transistor LDMOS changes due to a parasitic capacitance component, a level of the input voltage VIN also changes. While an ESD pulse increases, as a level of the gate voltage Vg increases, the input voltage VIN also increases while having a certain level difference from the gate voltage Vg. Next, when the ESD event ends, the input voltage VIN returns to the ground voltage level.

While the ESD pulse increases, the input voltage VIN is maintained to have a level lower than that of the gate voltage Vg. Accordingly, the channel of the first PMOS transistor MP1 is turned on and the triggering voltage Vtrig increases to be higher than the threshold voltage of the first NMOS transistor MN0. In addition, as the bulk of the first PMOS transistor MP1 is connected to the input voltage VIN, pulling up of the triggering voltage Vtrig may be accelerated by a parasitic bipolar component due to the source, the bulk, and the drain of the first PMOS transistor MP1. In other words, when an ESD event occurs, since a pull-up speed of the triggering voltage Vtrig may increase due to a path of a MOS channel of the first PMOS transistor MP1 and a path of a parasitic bipolar component, a time at which the first NMOS transistor MN0 is driven may be sooner in response to the ESD event.

FIG. 5B illustrates a parasitic diode component formed between the node 'b' and the gate of the LDMOS transistor LDMOS. Referring to FIG. 5B, the gate of the LDMOS transistor LDMOS may be connected to at least one node of the driving circuit 300 of FIG. 1, and the driving circuit 300 may include at least one transistor (for example, a PMOS transistor or an NMOS transistor) for driving the gate of the LDMOS transistor LDMOS. The driving circuit 300 controls the LDMOS transistor LDMOS in response to a control input C_IN as shown in (a) of FIG. 5B.

When the node 'b' corresponds to a source of the PMOS transistor, since a drain of the PMOS transistor is a p-type drain and a bulk of the PMOS transistor is an n-type bulk as shown in (b) of FIG. 5B, a p-n type parasitic diode component may be formed. The bulk and the source of the PMOS transistor may be connected to each other, and thus a parasitic diode component may be formed between the node 'b' and the gate of the LDMOS transistor LDMOS.

According to the above exemplary embodiments, since a circuit for controlling a clamping operation may be formed to include a CMOS and a resistor and thus may be applied to an existing circuit (without an additional process), an increase in an area for forming a circuit may be minimized. In addition, since a clamping operation is controlled by using both an operation of turning on a channel and an operation of turning on a parasitic bipolar component, a clamping response speed may be increased.

Figure 6:
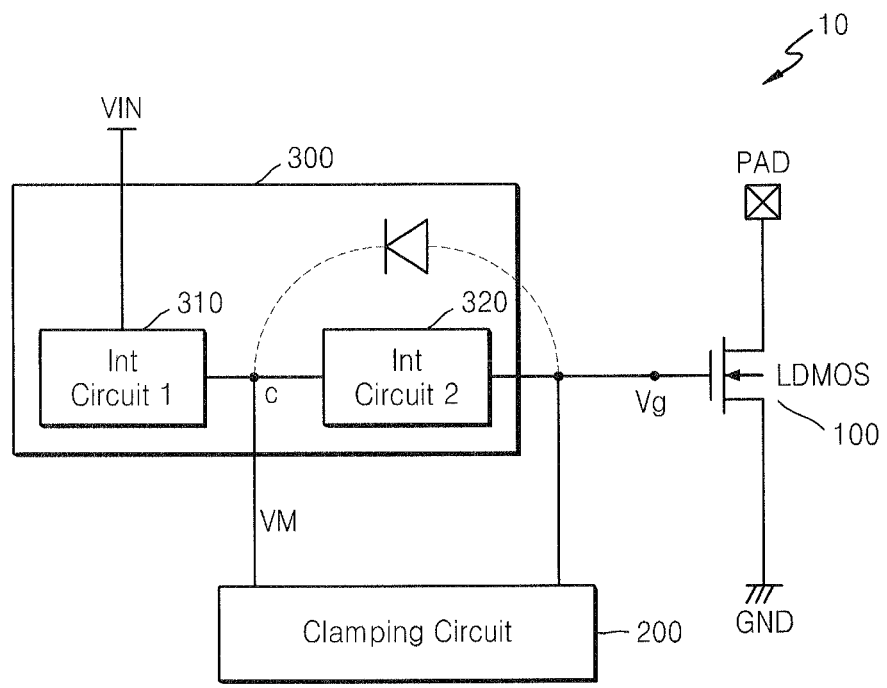
FIG. 6 is a block diagram illustrating a semiconductor apparatus according to an exemplary embodiment of the inventive concept.

FIG. 6 is a block diagram illustrating a semiconductor apparatus 10 according to an exemplary embodiment of the inventive concept. Certain elements shown in FIG. 6 may be the same as those shown in FIG. 5A. As described above, the clamping circuit 200 may clamp the gate voltage Vg of the LDMOS transistor LDMOS, and may control a clamping operation for the gate voltage Vg based on a level difference between the gate voltage Vg and at least one voltage (e.g., an internal voltage VM in FIG. 6) applied to the clamping circuit 200.

The input voltage VIN may be applied as an operating voltage of the driving circuit 300. The input voltage VIN may be input from the outside through another pad of the semiconductor apparatus 10 or may be generated in the semiconductor apparatus 10 by using a power supply voltage. The driving circuit 300 may include at least one internal circuit, for example, a first internal circuit 310 and a second internal circuit 320. A voltage applied to one node in the driving circuit 300 may be applied as the internal voltage VM to the clamping circuit 200. For example, a voltage of a node 'c' between the first internal circuit 310 and the second internal circuit 320 may be applied as the internal voltage VM to the clamping circuit 200.

In addition, a parasitic diode component may be formed between the node 'c' in the driving circuit 300 and the gate of the LDMOS transistor LDMOS, which are nodes for applying two voltages for controlling a clamping operation as described above. Accordingly, when an ESD event occurs, a level of a voltage (e.g., the internal voltage VM) of the node 'c' may increase as the gate voltage Vg increases, and while an ESD pulse increases, a clamping transistor is driven and a clamping operation is performed due to a level difference between the gate voltage Vg and the internal voltage VM.

Figure 7:
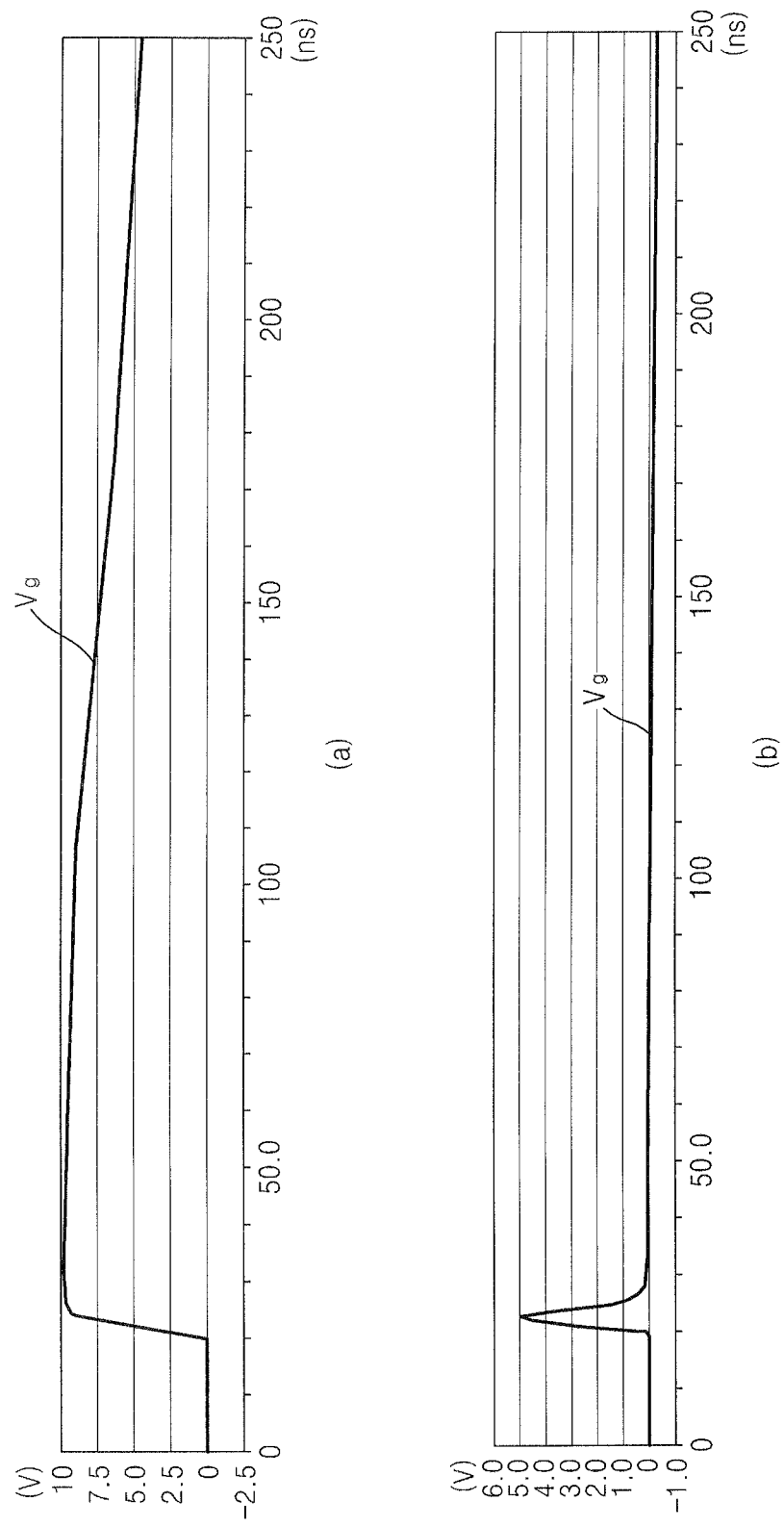
FIGS. 7A and 7B are graphs illustrating a relationship between the non-inclusion/inclusion of a clamping circuit according to an exemplary embodiment of the inventive concept and a wavelength of a gate voltage when an electrostatic discharge (ESD) pulse is applied.

FIGS. 7A and 7B are graphs illustrating a relationship between the non-inclusion/inclusion of a clamping circuit according to an exemplary embodiment of the inventive concept and a waveform of the gate voltage Vg when an ESD pulse is applied. FIG. 7A illustrates a case where a clamping circuit according to an exemplary embodiment of the inventive concept is not used, and FIG. 7B illustrates a case where a clamping circuit according to an exemplary embodiment of the inventive concept is used. For example, when an ESD pulse corresponding to 2 kV is applied to a drain of the LDMOS transistor LDMOS according to the Human Body Model (HBM), a waveform of the gate voltage Vg changes.

Referring to FIG. 7A, when a clamping circuit according to an exemplary embodiment of the inventive concept is not used, the gate voltage Vg maintains a voltage level of several volts (V) beyond a predetermined period of time after the ESD pulse has been applied. For example, a highest voltage level of the gate voltage Vg may be about 10 V. In addition, since the gate voltage Vg maintains a voltage level equal to or higher than 5V more than 150 ns after the ESD pulse begins to decrease, a channel of the LDMOS transistor LDMOS may be heated when an ESD event occurs.

Referring to FIG. 7B, when a clamping circuit according to an exemplary embodiment of the inventive concept is used, 5 V may be induced as the gate voltage Vg for 3 ns after an ESD event occurs, but an increase in the gate voltage Vg may be half of that compared to when the clamping circuit is not used. In addition, since the gate voltage Vg is clamped to a ground voltage level about 5 ns after the ESD event occurs, a probability that a gate of the LDMOS transistor LDMOS is turned on may be reduced. In particular, since an ESD event in the HBM has a rising period of about 6 ns, when the clamping circuit according to the present exemplary embodiment is used, the gate of the LDMOS transistor LDMOS may be effectively clamped when such an ESD event occurs. This clamping can be done without affecting a normal operation of a semiconductor system.

Figure 8:
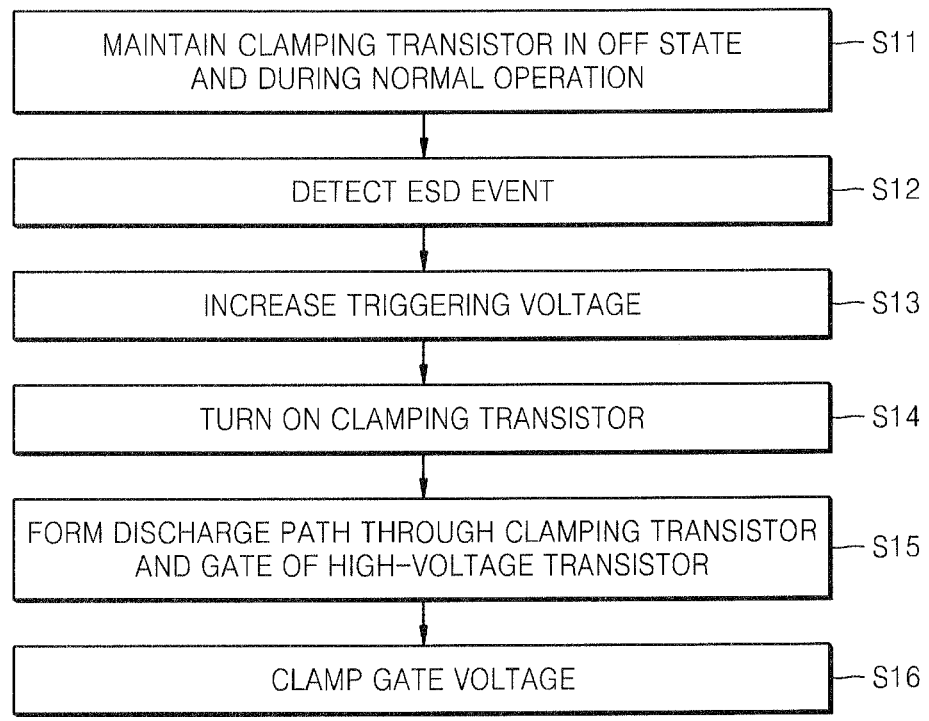
FIG. 8 is a flowchart illustrating a clamping method of a semiconductor apparatus, according to an exemplary embodiment of the inventive concept.

FIG. 8 is a flowchart illustrating a clamping method of a semiconductor apparatus, according to an exemplary embodiment of the inventive concept. The semiconductor apparatus may include a high-voltage transistor. In FIG. 8, a clamping circuit is provided in the semiconductor apparatus and starts an operation of clamping a gate of the high-voltage transistor when an ESD event occurs.

The clamping circuit includes a clamping transistor that is connected to the gate of the high-voltage transistor and clamps a gate voltage, and a triggering circuit that controls driving of the clamping transistor. In addition, the triggering circuit may output a triggering voltage as a control signal for controlling the clamping transistor, and may include a pull-up unit for pulling up the triggering voltage and a pull-down unit for pulling down the triggering voltage. The pull-up unit and the pull-down unit may include a pull-up transistor and a pull-down transistor, respectively.

In operation S11, when the semiconductor apparatus normally operates or a semiconductor system including the semiconductor apparatus normally operates, since the clamping transistor is maintained in an OFF state, the clamping circuit does not affect the semiconductor apparatus or the semiconductor system normally operates.

In operation S12, an ESD event is detected. The ESD event may be detected by being manually input by an external factor before the semiconductor system uses the semiconductor apparatus or when the semiconductor apparatus or the semiconductor system does not operate, or may be detected by being actively input according to an HBM as described above when the semiconductor apparatus is tested. In addition, the ESD event may be detected in any of various manners. For example, the ESD event may be detected by detecting a level difference between the gate voltage of the high-voltage transistor and at least one input voltage applied to the clamping circuit as described above.

In operation S13, as the ESD event is detected, the pull-up transistor of the triggering circuit may be driven to increase the triggering voltage, and thus the triggering voltage for controlling the clamping transistor may be pulled up. In operation S14, the clamping transistor is turned on in response to the trigging voltage. In operation S15, a discharge path is formed through the gate of the high-voltage transistor and the clamping transistor. In operation S16, the gate voltage of the high-voltage transistor that increased due to the ESD event is clamped along the discharge path.

Figure 9:
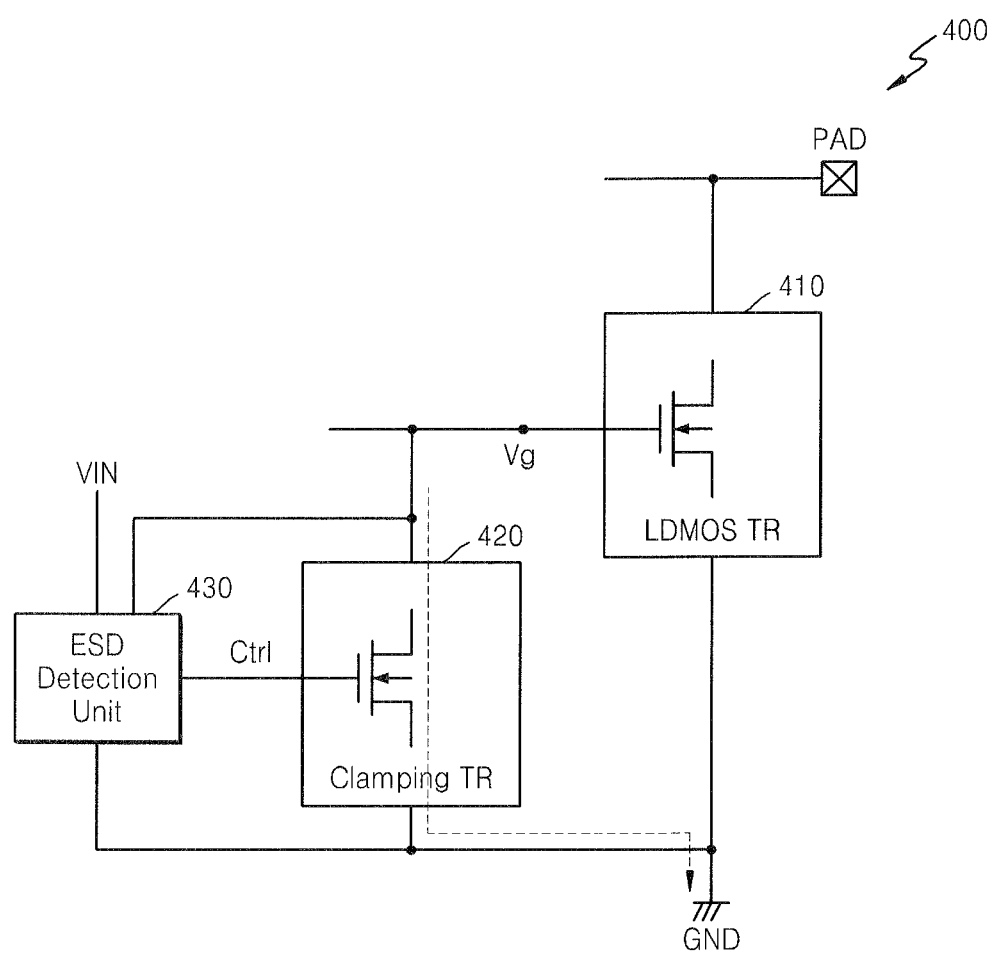
FIG. 9 is a block diagram illustrating a semiconductor apparatus according to an exemplary embodiment of the inventive concept.

FIG. 9 is a block diagram illustrating a semiconductor apparatus 400 according to an exemplary embodiment of the inventive concept. A structure of the semiconductor apparatus 400 of FIG. 9 may be substantially the same as that of the semiconductor apparatus 10 or the clamping circuit 200 of FIG. 1 or FIG. 3.

The semiconductor apparatus 400 may include an LDMOS transistor 410 as a high-voltage transistor, a clamping transistor 420 for clamping the gate voltage Vg of the LDMOS transistor 410, and an ESD detection unit 430 that outputs a clamping control signal Ctrl according to a result of a detection of an ESD event. As described above, one electrode of the LDMOS transistor 410 is connected to the pad PAD and the other electrode of the LDMOS transistor 410 is connected to the ground voltage GND. In addition, the clamping transistor 420 is connected between a gate of the LDMOS transistor 410 and the ground voltage GND, and the clamping control signal Ctrl output from the ESD detection unit 430 is applied to a gate of the clamping transistor 420. In addition, the input voltage VIN for driving the ESD detection unit 430 may be applied to the ESD detection unit 430.

The ESD detection unit 430 may detect an increase in the gate voltage Vg. For example, when the gate voltage Vg exceeds a threshold value, it may be determined that an ESD event is detected and the control signal Ctrl is output. The ESD detection unit 430 may be substantially the same as the triggering circuit 220 of FIG. 4 or 5A in terms of configuration, and at least one MOS transistor may be provided in the ESD detection unit 430. In addition, although the ESD detection unit 430 is connected to the input voltage supply that applies the input voltage VIN in FIG. 9, the ESD detection unit 430 may be connected to a voltage supply that applies a voltage having a different level and thus the clamping control signal Ctrl may be activated when the gate voltage Vg increases to be higher than the threshold value.

According to a result of the detection of the ESD event, the clamping transistor 420 may be turned on by changing a level of the clamping control signal Ctrl. In other words, a level of the clamping control signal Ctrl may change in response to the gate voltage Vg. When the clamping transistor 420 is turned on, a discharge path through the clamping transistor 420 and the gate of the LDMOS transistor 420 is formed as described above.

Figure 10:
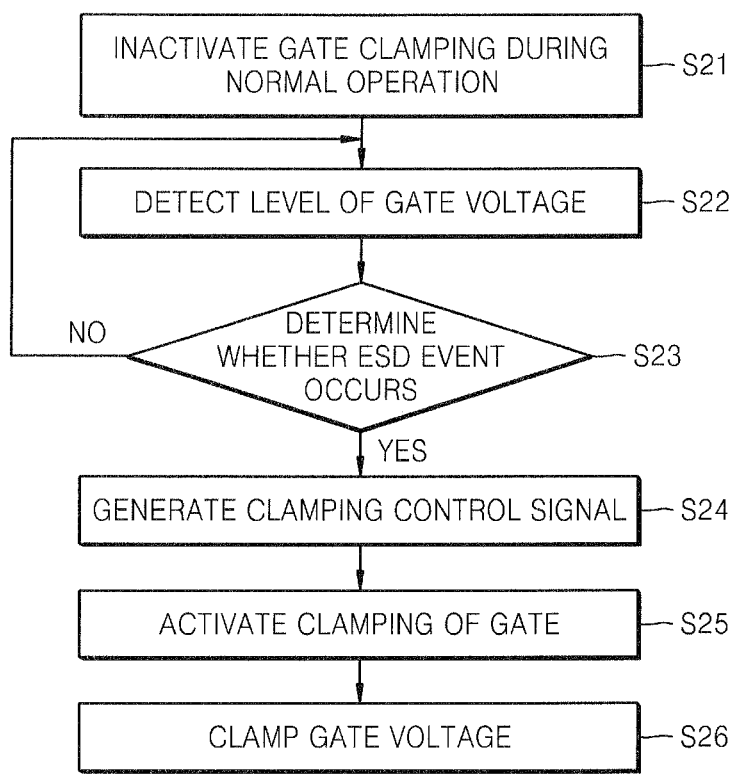
FIG. 10 is a flowchart illustrating an operation of the semiconductor apparatus of FIG. 9, according to an exemplary embodiment of the inventive concept.

FIG. 10 is a flowchart illustrating an operation of the semiconductor apparatus 400 of FIG. 9, according to an exemplary embodiment of the inventive concept. Referring to FIG. 10, in operation S21, when the semiconductor apparatus 400 including the high-voltage transistor (for example, the LDMOS transistor 410) and the clamping transistor 420 normally operates or a semiconductor system including the semiconductor apparatus 400 normally operates, a clamping operation for the gate of the high-voltage transistor is inactivated by maintaining the clamping transistor 420 in an OFF state.

In operation S22, a level of the gate voltage Vg of the LDMOS transistor 410 is detected. For example, it is determined whether the level of the gate voltage Vg of the LDMOS transistor 410 exceeds a threshold voltage. If the level of the gate voltage Vg of the LDMOS transistor 410 does not exceed the threshold voltage, it is determined, in operation S23, that an ESD event does not occur and an operation of detecting a level of the gate voltage Vg of the LDMOS transistor 410 is continuously performed. In operation S23, if the level of the gate voltage Vg of the LDMOS transistor 410 exceeds the threshold voltage, it is determined that an ESD event occurs. In operation S24, a clamping control signal corresponding to a result of the detection of the ESD event is generated.

In operation S25, the generated clamping control signal is applied to a gate of the clamping transistor 420 to turn on the clamping transistor 420, and clamping of the gate of the LDMOS transistor 410 is activated. In operation S26, as the clamping transistor 420 connected between the ground voltage supply that applies the ground voltage GND and the gate of the LDMOS transistor 410 is turned on to form a discharge path, the gate voltage Vg of the LDMOS transistor 410 is clamped through the discharge path.

Figure 11:
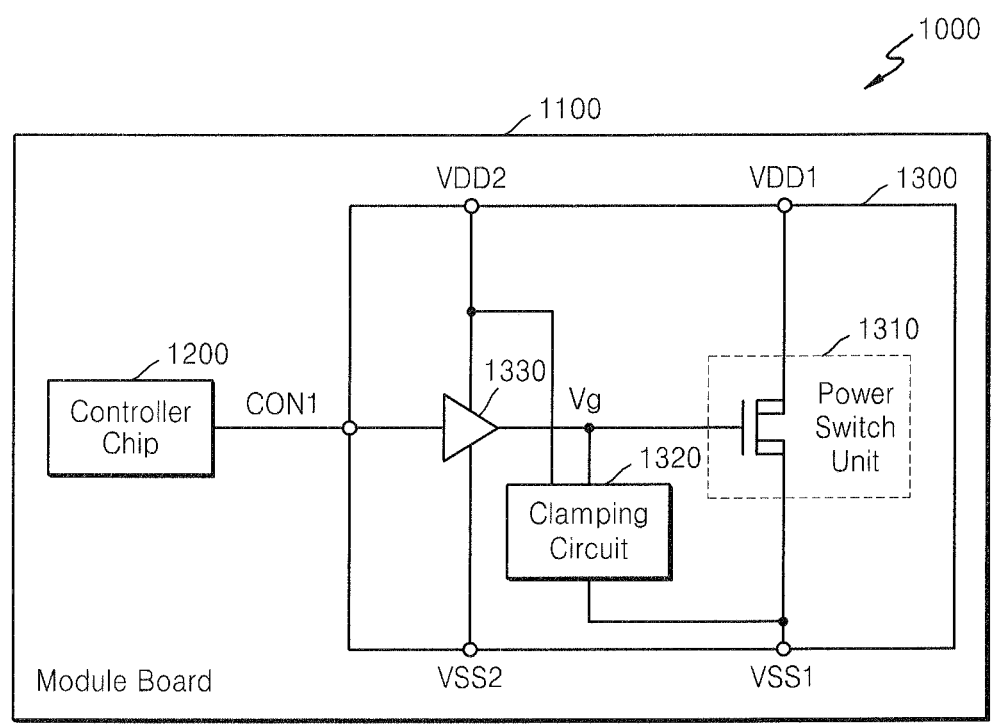
FIG. 11 is a block diagram illustrating a semiconductor system including a semiconductor apparatus, according to an exemplary embodiment of the inventive concept.

FIG. 11 is a block diagram illustrating a semiconductor system 1000 including a semiconductor apparatus 1300, according to an exemplary embodiment of the inventive concept. Referring to FIG. 11, the semiconductor system 1000 includes a module board 1100, and the semiconductor apparatus 1300 is mounted on the module board 1100. In addition, a controller chip 1200 for driving the semiconductor apparatus 1300 is mounted on the module board 1100. The semiconductor apparatus 1300 and the controller chip 1200 may be different semiconductor chips. In addition, the semiconductor apparatus 1300 may be formed as any of different levels of chips. For example, the semiconductor apparatus 1300 may have a wafer level chip scale or another level chip scale.

The semiconductor apparatus 1300 may be provided in the semiconductor system 1000 and may provide various functions. For example, the semiconductor apparatus 1300 may receive main power and convert the main power into voltage for other circuit devices or distribute the main power, or may form a high-voltage or a high-current path for high-voltage driving of an external IC. For example, in FIG. 11, the semiconductor apparatus 1300 manages power. To this end, a power switch unit 1310 includes a high-voltage transistor.

The controller chip 1200 may be mounted on the module board 1100 and may communicate with an external device outside the module board 1100. In addition, the controller chip 1200 may generate a control signal CON1 for controlling the semiconductor apparatus 1300 and may output the control signal CON1 to the semiconductor apparatus 1300 through an electrical wiring formed on the module board 1100. For example, the semiconductor apparatus 1300 may further include a driving circuit 1330 for driving the high-voltage transistor of the power switch unit 1310, and the controller chip 1200 may output the control signal CON1 and may control the driving circuit 1330. The semiconductor apparatus 1300 may include at least one pad, and may receive or output various signals through the pad. For example, the semiconductor apparatus 1300 may receive power supply voltages VDD1 and VDD2 used to operate the semiconductor apparatus 1300, and may apply power to an external apparatus (not shown) based on a switching operation of the high-voltage transistor.

As described above, an ESD charge may be injected into the semiconductor apparatus 1300 through the pad, and a voltage of a gate of the high-voltage transistor may increase according to a parasitic capacitance component formed between the gate and a drain of the high-voltage transistor. To clamp the gate of the high-voltage transistor, a clamping circuit 1320 is provided in the semiconductor apparatus 1300. For example, the clamping circuit 1320 may be connected between a ground voltage supply that applies a ground voltage VSS1 and the gate of the high-voltage transistor, and clamps a gate voltage Vg of the high-voltage transistor. The power supply voltage VDD2 may be applied to the clamping circuit 1320, and an operation of detecting an ESD event may be performed by using the gate voltage Vg and the power supply voltage VDD2. Although not shown in FIG. 11, another voltage signal may be applied to the clamping circuit 1320. For example, the driving circuit 1330 may include a circuit unit that generates an internal signal by processing the control signal CON1, and a gate driving unit that drives the gate of the high-voltage transistor. A voltage of one node in the driving circuit 1330, instead of the power supply voltage VDD2, may be applied to the clamping circuit 1320. Also, the driving circuit 1330 may be connected between the power supply voltage VDD2 and a ground voltage VSS2. Although the ground voltage VSS2 connected to the driving circuit 1330 and the ground voltage VSS1 connected to the power switch unit 1310 are input in different paths in FIG. 11, the ground voltages VSS1 and VSS2 may be the same voltage.

Although a power management chip for performing a power management operation is illustrated as the semiconductor apparatus 1300 in FIG. 11, the present exemplary embodiment is not limited thereto. For example, the semiconductor apparatus 1300 may include an LDMOS transistor and may form a high-voltage or a high-current path along with another IC or may perform another function as described above.

Figure 12:
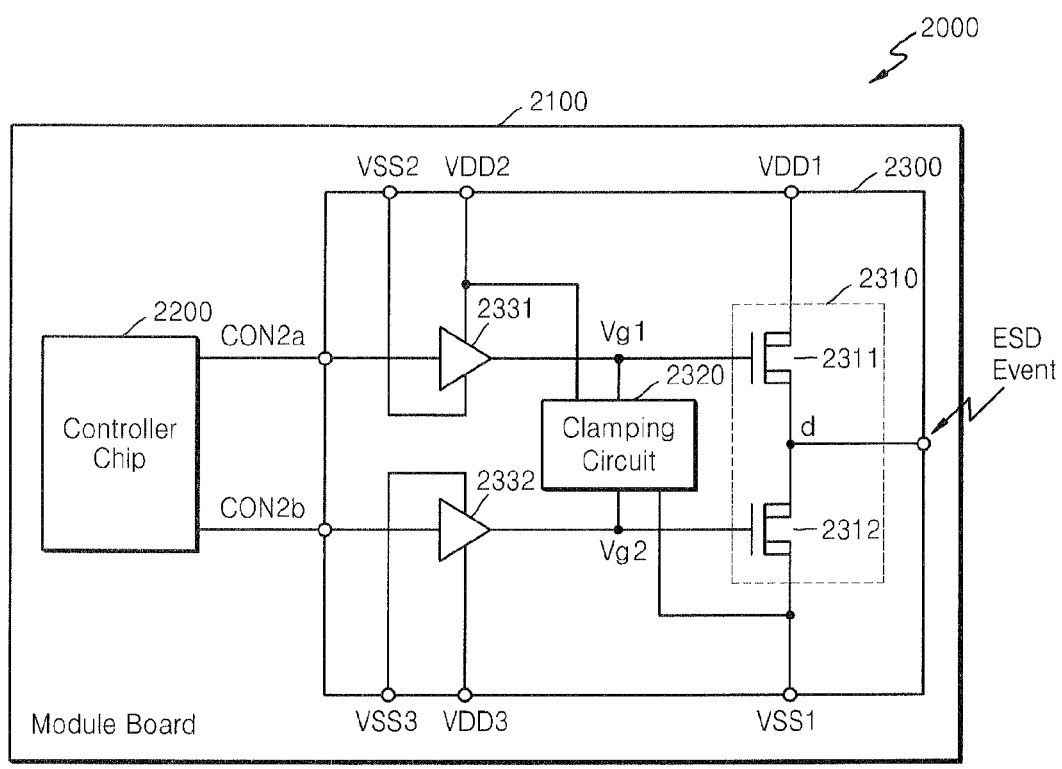
FIG. 12 is a block diagram illustrating a semiconductor system including a semiconductor apparatus, according to an exemplary embodiment of the inventive concept.

FIG. 12 is a block diagram illustrating a semiconductor system 2000 including a semiconductor apparatus 2300 according to an exemplary embodiment of the inventive concept. Certain elements shown in FIG. 12 may be the same as those shown in FIG. 11. Referring to FIG. 12, the semiconductor system 2000 may include the semiconductor apparatus 2300 and a controller chip 2200 mounted on a module board 2100. The semiconductor apparatus 2300 may include a power switch unit 2310 for switching a high voltage, and the power switch unit 2310 may manage power by including at least two high-voltage transistors. In FIG. 12, the power switch unit 2310 includes first and second transistors 2311 and 2312, and at least one of the first and second transistors 2311 and 2312 may be formed as a high-voltage transistor or both the first and second transistors 2311 and 2312 may be formed as high-voltage transistors. It is assumed that both the first and second transistors 2311 and 2312 are high-voltage transistors.

To drive the power switch unit 2310, first and second driving circuits 2331 and 2332 may be provided in the semiconductor apparatus 2300. The first driving circuit 2331 outputs a driving signal to a gate of the first high-voltage transistor 2311 and controls switching of the first high-voltage transistor 2311. The second driving circuit 2332 outputs a driving signal to a gate of the second high-voltage transistor 2312 and controls switching of the second high-voltage transistor 2312. The controller chip 2200 generates control signals CON2*a* and CON2*b* and respectively applies the control signals CON2*a* and CON2*b* to the first and second driving circuits 2331 and 2332. The first driving circuit 2331 may be connected between the power supply voltage VDD2 and the ground voltage VSS2, and the second driving circuit 2332 may be connected between a power supply voltage VDD3 and a ground voltage VSS3. The power supply voltages VDD2 and VDD3 have the same voltage level or different voltage levels. Although the ground voltages VSS1, VSS2, and VSS3 are input in different paths in FIG. 12, the ground voltages VSS1, VSS2, and VSS3 may be the same voltage.

In addition, the semiconductor apparatus 2300 may further include a clamping circuit 2320 for clamping the gates of the first and second high-voltage transistors 2311 and 2312. The clamping circuit 2320 may clamp the gates of the first and second high-voltage transistors 2311 and 2312 in substantially the same manner as described above. Although the clamping circuit 2320 is commonly connected to the first and second high-voltage transistors 2311 and 2312 in FIG. 12, separate clamping circuits may be disposed to be respectively connected to the first and second high-voltage transistors 2311 and 2312. When an ESD event occurs, the clamping circuit 2320 may clamp a first gate voltage Vg1 of the first high-voltage transistor 2311 and a second gate voltage Vg2 of the second high-voltage transistor 2312. In addition, although the power supply voltage VDD2 is applied to the clamping circuit 2320 in FIG. 12, another voltage (for example, a voltage in any driving circuit) may be applied to the clamping circuit 2320.

It is assumed that an ESD charge is injected due to an ESD event at a pad connected to a common node 'd' between the first and second high-voltage transistors 2311 and 2312. When the ESD charge is injected, since the common node 'd' has a relatively high voltage level, the common node 'd' may correspond to drains of the first and second high-voltage transistors 2311 and 2312. In addition, a parasitic capacitance component (not shown) is formed between a drain and a gate of each of the first and second high-voltage transistors 2311 and 2312. Accordingly, as a level of a voltage of the common node 'd' increases during an ESD event, levels of the gate voltages Vg1 and Vg2 of the first and second high-voltage transistors 2311 and 2312 may also increase.

The clamping circuit 2320 includes at least one clamping transistor (not shown) therein, and the clamping transistor is turned on/off according to a result of the detection of the ESD event. In addition, the clamping transistor may include a transistor that connects the first gate voltage Vg1 and the ground voltage supply that applies the ground voltage VSS1 and a transistor that connects the second gate voltage Vg2 and the ground voltage supply that applies the ground voltage VSS1. The first and second gate voltages Vg1 and Vg2 may be clamped in substantially the same manner as described above.

Figure 13:
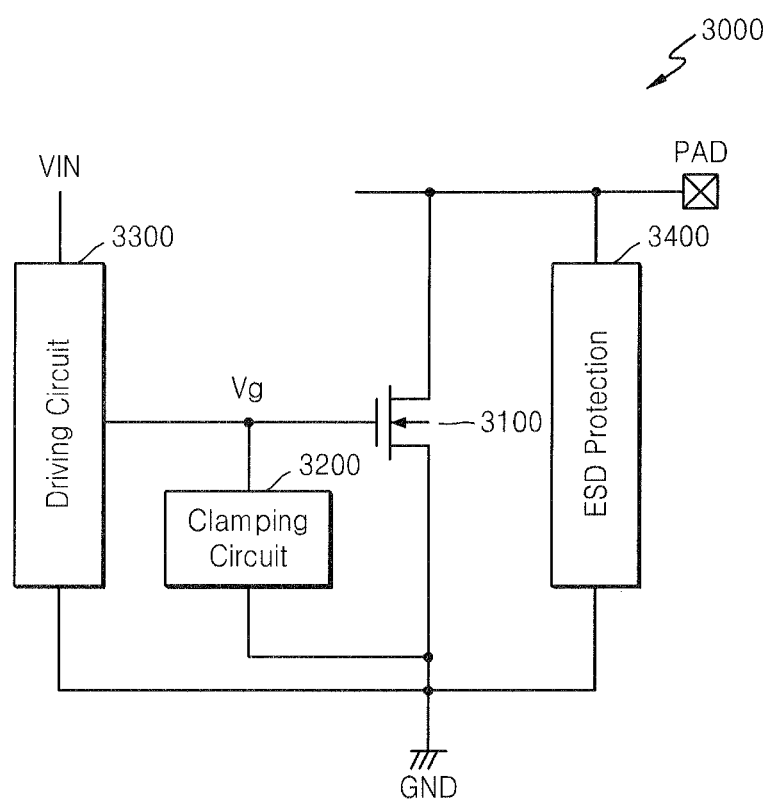
FIG. 13 is a block diagram illustrating a semiconductor apparatus according to an exemplary embodiment of the inventive concept.

FIG. 13 is a block diagram illustrating a semiconductor apparatus 3000 according to an exemplary embodiment of the inventive concept. Referring to FIG. 13, a high-voltage transistor 3100, a driving circuit 3300, a clamping circuit 3200 and an ESD protection circuit 3400 are included in the semiconductor apparatus 3000. The same elements as those in the above embodiments may have the same structures and the same operations, and thus a detailed explanation thereof will not be given.

Referring to FIG. 13, to prevent damage to a device in the semiconductor apparatus 3000 due to an ESD event, the ESD protection circuit 3400 may be directly connected to the pad PAD. For example, the ESD protection circuit 3400 may be connected in parallel to the high-voltage transistor 3100 so that at least a part of an ESD charge may be branched through the ESD protection circuit 3400.

Even when the ESD protection circuit 3400 is included, since the high-voltage transistor 3100 may be turned on earlier than a protection operation of the ESD protection circuit 3400 starts due to an ESD event, an ESD level may be reduced. According to the present exemplary embodiment, since the clamping circuit 3200 connected between the ground voltage supply that applies the ground voltage GND and a gate of the high-voltage transistor 3100 is provided in addition to the ESD protection circuit 3400 disposed parallel to the high-voltage transistor 3100, when a level of the gate voltage Vg of the high-voltage transistor 3100 increases despite the ESD protection circuit 3400, the clamping circuit 3200 detects the increase and clamps the gate voltage Vg. Accordingly, a decrease in an ESD level due to channel heating of the high-voltage transistor 3100 may be reduced.

Figure 14:
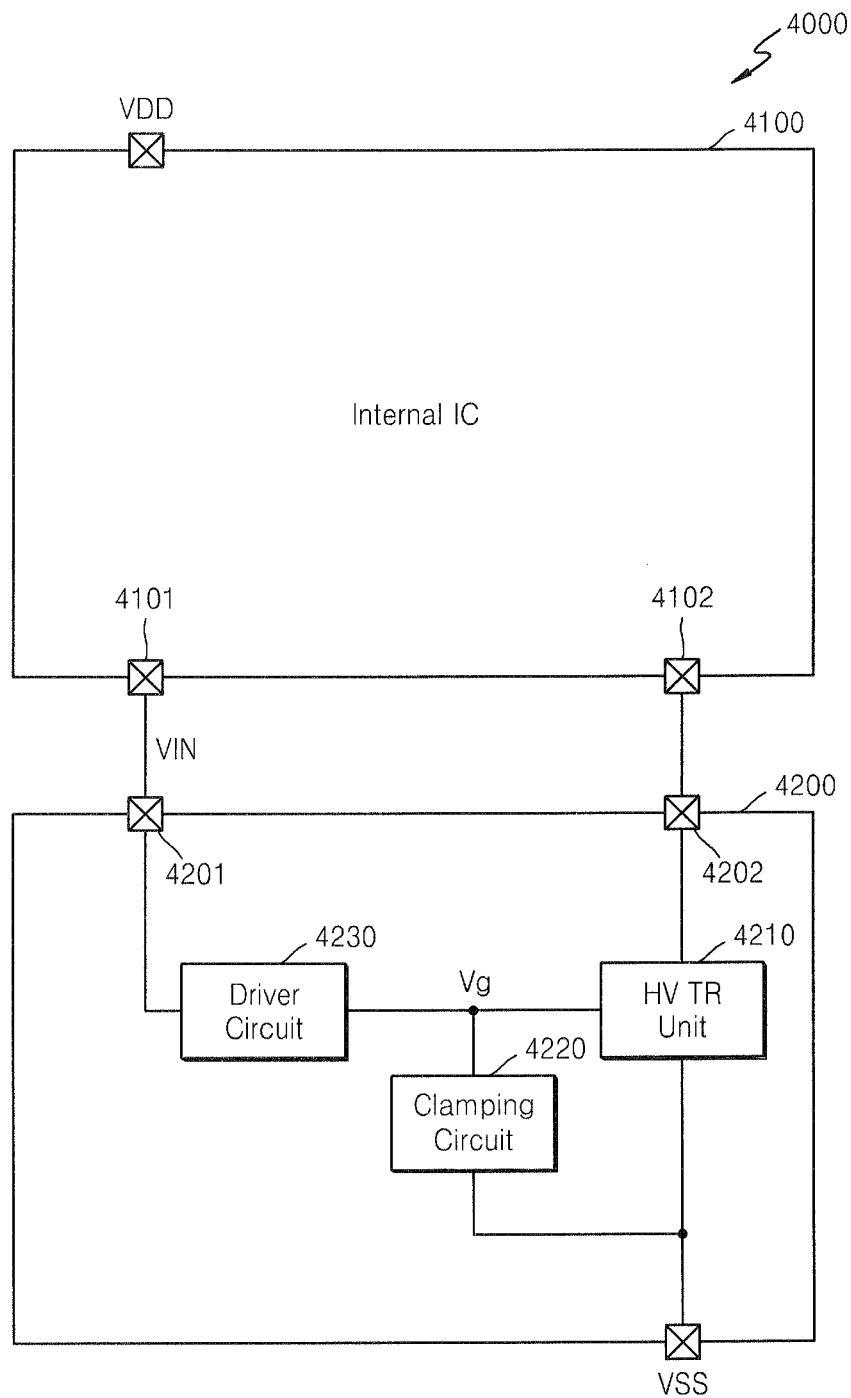
FIG. 14 is a block diagram illustrating a semiconductor apparatus mounted on a semiconductor system, according to an exemplary embodiment of the inventive concept.

FIG. 14 is a block diagram illustrating a semiconductor apparatus 4200 mounted on a semiconductor system 4000, according to an exemplary embodiment of the inventive concept. FIG. 15 is a table showing levels of various voltages in the semiconductor system 4000.

Referring to FIG. 14, the semiconductor system 4000 may include an internal IC 4100, and the semiconductor apparatus 4200 electrically connected to the internal IC 4100. As described above, the semiconductor apparatus 4200 may be provided in the semiconductor system 4000 and may perform various functions. For example, the semiconductor apparatus 4200 may include a high-voltage transistor unit 4210 and may manage power for the internal IC 4100. The internal IC 4100 and the semiconductor apparatus 4200 may transmit/receive various signals through at least one pad. For example, one or more pads 4101 and 4102 of the internal IC 4100 may be electrically connected to the one or more pads 4201 and 4202 of the semiconductor apparatus 4200. In addition, the internal IC 4100 may perform various operations by using a power supply voltage VDD, and the semiconductor apparatus 4200 may receive at least one voltage (for example, the input voltage VIN) from the internal IC 4100. An example where the input voltage VIN is applied to the semiconductor apparatus 4200 through one pad 4101 of the internal IC 4100 is illustrated in FIG. 14. The semiconductor apparatus 4200 may further include a driving circuit 4230 for driving the high-voltage transistor unit 4210, and a clamping circuit 4220 for clamping the gate voltage Vg of the high-voltage transistor unit 4210. The high-voltage transistor unit 4210 may be connected between a ground voltage VSS and the pad 4202 of the semiconductor apparatus 4200. For example, the high-voltage transistor 4210 may manage power supplied to the internal IC 4100 through the pads 4102 and 4202.

Referring to FIG. 15, levels of various voltages related to a clamping operation may vary according to an operation mode of the semiconductor apparatus 4200 or the semiconductor system 4000, and activation of the clamping circuit 4220 may be controlled.

For example, when the semiconductor apparatus 4200 or the semiconductor system 4000 normally operates, the clamping circuit 4220 does not affect an operation of the semiconductor apparatus 4200 or the semiconductor system 4000. In other words, during a normal operation, the input voltage VIN has a level higher than that of the gate voltage Vg of the high-voltage transistor unit 4210, and thus a clamping transistor included in the clamping circuit 4220 is turned off, thereby inactivating the clamping circuit 4220.

By contrast, before the semiconductor system 4000 uses the semiconductor apparatus 4200 or when the semiconductor apparatus 4200 or the semiconductor system 4000 does not operate (for example, a non-operation period NOP), the input voltage VIN may have a ground voltage level (e.g., 0V) and the gate of the high-voltage transistor unit 4210 may be in a floating state. In this case, the clamping transistor is turned off and thus clamping circuit 4220 is inactivated.

By contrast, when an ESD event occurs during the non-operation period NOP, the gate voltage Vg of the high-voltage transistor unit 4210 increases due to a parasitic capacitance component between the gate and a drain of the high-voltage transistor unit 4210 and an injection of an ESD charge. In addition, a parasitic diode component may be formed between a node that applies the input voltage VIN and the gate of the high-voltage transistor 4210, and thus the gate voltage Vg increases and the input voltage VIN increases along with a level of the gate voltage Vg from the ground voltage level. While an ESD pulse increases during an initial period of the ESD event, the gate voltage Vg has a level higher than that of the input voltage VIN.

A control signal is generated according to a result of a detection of a level difference between the gate voltage Vg and the input voltage VIN. As the clamping transistor is turned on due to the generated control signal, the clamping circuit 4220 is activated, and the gate voltage Vg of the high-voltage transistor unit 4210 is clamped.

As described above, in accordance with a clamping circuit, a semiconductor apparatus including the same, and a clamping method of the semiconductor apparatus of exemplary embodiments of the inventive concept, damage to a device due to an ESD event or the like may be prevented.

In addition, since a clamping circuit optimized for a high-voltage transistor and a semiconductor apparatus including the clamping circuit according to exemplary embodiments of the inventive concept are provided, performance degradation of the semiconductor apparatus due to an ESD event may be reduced.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A semiconductor apparatus, comprising:
a first high-voltage transistor having a first gate and a first electrode, the first electrode being connected to a pad; and
a clamping circuit comprising:
a first transistor having a second gate and being connected to the first gate; and
a triggering circuit configured to receive a first voltage and to generate and provide a triggering voltage to the first transistor, the triggering circuit being connected to the first gate, wherein the clamping circuit is configured to detect a change in a level of a voltage of the first gate due to electrostatic discharge (ESD) and to clamp the voltage of the first gate according to a result of the detection.

2. The semiconductor apparatus of claim 1, wherein the first high-voltage transistor is a power switch that controls transmission of power.

3. The semiconductor apparatus of claim 1, wherein the first high-voltage transistor has a second electrode connected to a ground voltage and the first high-voltage transistor is a lateral diffused metal-oxide semiconductor (LDMOS) transistor.

4. The semiconductor apparatus of claim 1, wherein the first electrode is directly connected to the pad.

5. The semiconductor apparatus of claim 1, wherein the triggering circuit comprises:
a pull-up unit connected to the first gate and the second gate; and
a pull-down unit connected to the second gate and the pull-up unit.

6. The semiconductor apparatus of claim 5, wherein the pull-up unit and the pull-down unit are connected to the first voltage.

7. The semiconductor apparatus of claim 6, wherein the triggering circuit further comprises a resistor, the resistor being connected between the first voltage and a gate of the pull-up unit.

8. The semiconductor apparatus of claim 5, wherein the pull down unit and the first transistor are connected to the ground voltage.

9. The semiconductor apparatus of claim 1, further comprising a parasitic diode component being connected between the first voltage and the first gate.

10. A semiconductor apparatus, comprising:
a first high-voltage transistor having a first gate and a first electrode, the first electrode being connected to a pad; and
a clamping circuit comprising a pull-up unit and a pull-down unit,
wherein the clamping circuit is configured to detect a change in a level of a voltage of the first gate due to electrostatic discharge (ESD) and to clamp the voltage of the first gate according to a result of the detection; and
wherein the clamping circuit is connected to the pad through the first high-voltage transistor.

11. The semiconductor apparatus of claim 10, wherein gates of the pull-up unit and the pull-down unit are connected to a first voltage; and
wherein the pull-up unit is connected to the first gate.

12. The semiconductor apparatus of claim 10, wherein the clamping circuit further comprises a first transistor, the first transistor being connected to the first gate and the pull-up unit.

13. The semiconductor apparatus of claim 12, wherein the clamping circuit generates and provides a triggering voltage to the first transistor.

14. The semiconductor apparatus of claim 13, wherein the clamping circuit, the first transistor and the first high-voltage transistor are connected to a ground voltage.

15. The semiconductor apparatus of claim 10, wherein the first high-voltage transistor is a power switch that controls transmission of power.

16. The semiconductor apparatus of claim 15, wherein the first high-voltage transistor is a lateral diffused metal-oxide semiconductor (LDMOS) transistor.

17. A semiconductor apparatus, comprising:
a first high-voltage transistor having a gate and a drain, the drain being connected to a pad; and
a clamping circuit comprising a clamping transistor, the clamping transistor being formed between the gate of the first high-voltage transistor and a ground,
wherein the clamping circuit is configured to detect a change in a level of a voltage of the gate of the first high-voltage transistor due to electrostatic discharge (ESD) and to clamp the voltage of the gate of the first high-voltage transistor according to a result of the detection; and
wherein the clamping circuit is connected to the pad through the first high-voltage transistor.

18. The semiconductor apparatus of claim 17, wherein the first high-voltage transistor is a power switch that controls transmission of power.

19. The semiconductor apparatus of claim 18, wherein the first high-voltage transistor is a lateral diffused metal-oxide semiconductor (LDMOS) transistor.

20. The semiconductor apparatus of claim 17, wherein the clamping circuit further comprises a pull-up unit and a pull-down unit;
   wherein a gate of the clamping transistor is connected to both of the pull-up unit and the pull-down unit; and
   wherein the clamping circuit is connected to a first voltage.

* * * * *